United States Patent
Yang et al.

(10) Patent No.: US 12,500,190 B2
(45) Date of Patent: Dec. 16, 2025

(54) ELECTRONIC DEVICE

(71) Applicant: AUO Corporation, Hsinchu (TW)

(72) Inventors: Woei-Chyuan Yang, Hsinchu (TW); Hsiu Lin Chan, Hsinchu (TW); Chia Yen Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 372 days.

(21) Appl. No.: 18/446,447

(22) Filed: Aug. 8, 2023

(65) Prior Publication Data
US 2024/0304578 A1    Sep. 12, 2024

(30) Foreign Application Priority Data
Mar. 7, 2023 (TW) ................................. 112108277

(51) Int. Cl.
*H01L 23/00* (2006.01)
*H01L 23/50* (2006.01)
*H01L 25/18* (2023.01)

(52) U.S. Cl.
CPC .............. *H01L 24/06* (2013.01); *H01L 23/50* (2013.01); *H01L 24/05* (2013.01); *H01L 25/18* (2013.01); *H01L 2224/05553* (2013.01); *H01L 2224/06152* (2013.01)

(58) Field of Classification Search
CPC ......... H01L 24/06; H01L 23/50; H01L 24/05; H01L 25/18; H01L 2224/05553; H01L 2224/06152; G09F 9/30
See application file for complete search history.

(56) References Cited

U.S. PATENT DOCUMENTS

2021/0011325 A1* 1/2021 Yeh ...................... G02F 1/13454

FOREIGN PATENT DOCUMENTS

| CN | 110579917 | 12/2019 |
| CN | 111681544 | 9/2020 |
| CN | 113823241 | 12/2021 |
| CN | 114397786 | 4/2022 |

* cited by examiner

*Primary Examiner* — Tucker J Wright
(74) *Attorney, Agent, or Firm* — JCIPRNET

(57) ABSTRACT

An electronic device includes a substrate, output pads, input pads, auxiliary pads, a driving chip, edge pad groups, first connection lines, a first electronic component, and signal lines. The input pads and the auxiliary pads are closer to an edge of the substrate than the output pads. The edge pad groups are located between the driving chip and the edge of the substrate. Each of the edge pad groups includes a first pad and a second pad. Each of the first connection lines is electrically connected to one of the auxiliary pads and one of first pads of the edge pad groups. The first electronic component has conductive portions. The first pad and the second pad of each of the edge pad groups are electrically connected to one of the conductive portions. The signal lines are electrically connected to the output pads and second pads of the edge pad groups.

9 Claims, 7 Drawing Sheets

ELECTRONIC DEVICE

CROSS-REFERENCE TO RELATED APPLICATION

This application claims the priority benefit of Taiwan application serial no. 112108277, filed on Mar. 7, 2023. The entirety of the above-mentioned patent application is hereby incorporated by reference herein and made a part of this specification.

BACKGROUND

Technical Field

The disclosure relates to an electronic device.

Description of Related Art

With the development and popularization of display technology, the consumers require display panels to have not only high resolution, high contrast, high color saturation, and wide viewing angle but also pleasing appearance. For example, the consumers hope that the display panel has a narrow border or even no border. Generally, multiple signal lines disposed in the active area of the display panel are electrically connected to the driving chip of the display panel through multiple fan-out traces, which are disposed in the lower border of the display panel. When the display panel has higher resolution, the number of signal lines increases, and more fan-out traces are needed in order to electrically connect the large number of signal lines to the driving chip of the display panel. However, when the number of fan-out traces is large, it is not easy to reduce the width of the lower border of the display panel.

SUMMARY

The disclosure provides an electronic device with a small border width.

The disclosure provides another electronic device with a small border width.

The electronic device of an embodiment of the disclosure includes a substrate, multiple output pads, multiple input pads, multiple auxiliary pads, a driving chip, multiple edge pad groups, multiple first connection lines, a first electronic component, and multiple signal lines. The substrate has an active area, a peripheral area, and an edge. The active area, the peripheral area, and the edge are sequentially arranged in a first direction. The output pads are disposed on the peripheral area of the substrate. The input pads are disposed on the peripheral area of the substrate. The input pads are closer to the edge of the substrate than the output pads. The auxiliary pads are disposed on the peripheral area of the substrate. The auxiliary pads are closer to the edge of the substrate than the output pads, and the auxiliary pads are located beside the input pads. The driving chip is bonded to the input pads, the output pads, and the auxiliary pads. The edge pad groups are disposed on the peripheral area of the substrate and located between the driving chip and the edge of the substrate. Each of the edge pad groups includes a first pad and a second pad arranged in a second direction. The first direction and the second direction intersect. The first connection lines are disposed between the auxiliary pads and the edge pad groups. Each of the first connection lines is electrically connected to one of the auxiliary pads and one of the first pads of the edge pad groups. The first electronic component is bonded to the edge pad groups. The first electronic component has multiple conductive portions. The first pad and the second pad of each of the edge pad groups are electrically connected to one of the conductive portions, and the first pad and the second pad of each of the edge pad groups are electrically connected to each other. The signal lines are disposed on the active area and the peripheral area of the substrate. The signal lines are electrically connected to the output pads and the second pads of the edge pad groups.

The electronic device of an embodiment of the disclosure includes a substrate, multiple output pads, multiple input pads, multiple auxiliary pads, multiple bus lines, multiple first conductive components, and a driving chip. The substrate has an active area, a peripheral area, and an edge. The active area, the peripheral area, and the edge are sequentially arranged in a first direction. The output pads are disposed on the peripheral area of the substrate. The input pads are disposed on the peripheral area of the substrate. The input pads are closer to the edge of the substrate than the output pads. The auxiliary pads are disposed on the peripheral area of the substrate. The auxiliary pads are closer to the edge of the substrate than the output pads, and the auxiliary pads are located beside the input pads. The bus lines are disposed between the output pads and the input pads. The first conductive components are disposed between the bus lines and the auxiliary pads. Each of the first conductive components has a first break and a first portion and a second portion spaced by the first break. The first portion of each of the first conductive components is electrically connected to one of the bus lines, and the second portion of each of the first conductive components is electrically connected to one of the auxiliary pads. The driving chip is bonded to the input pads, the output pads, and the auxiliary pads.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
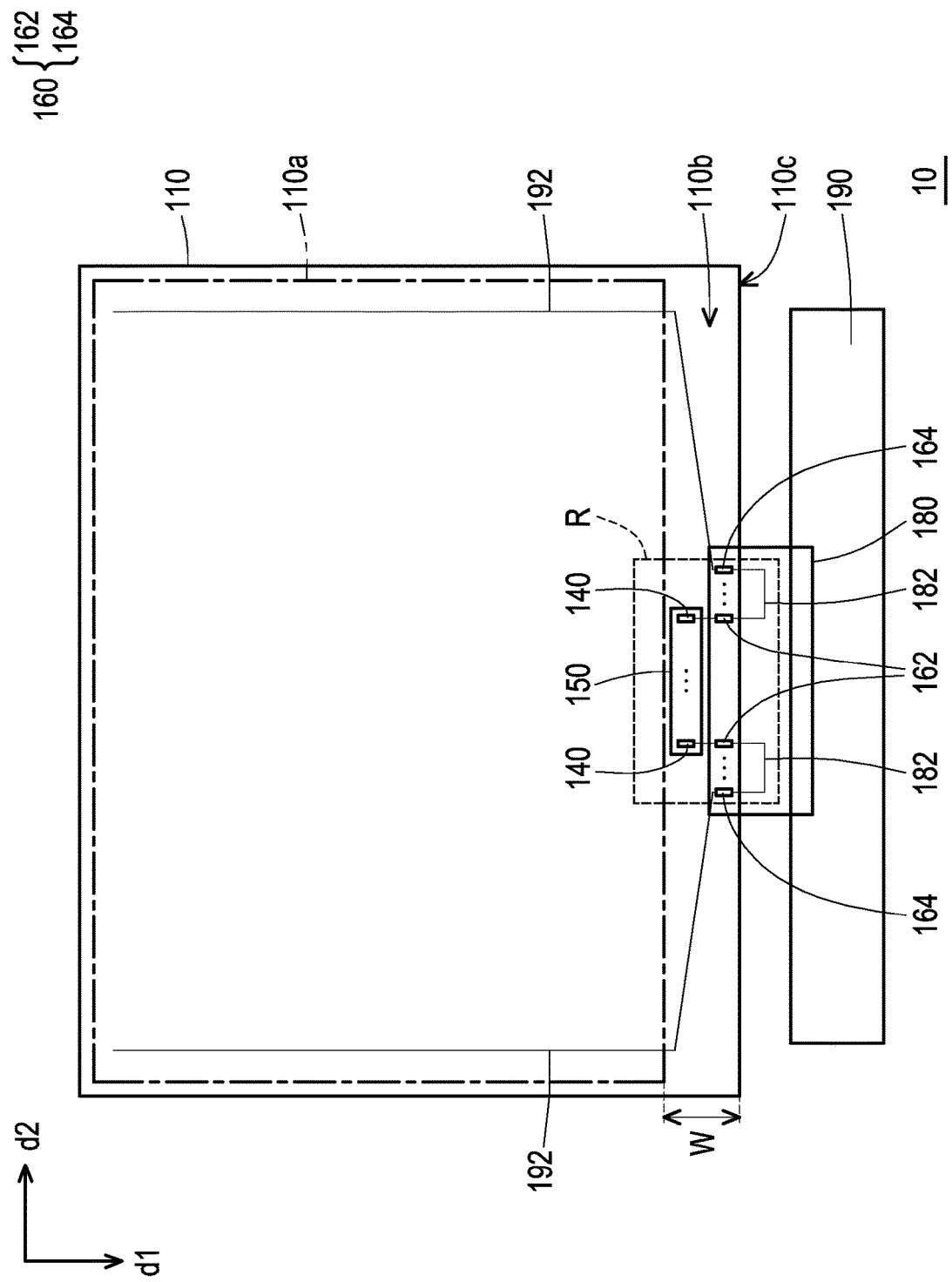
FIG. 1 is a schematic top view of an electronic device of the first embodiment of the disclosure.

Descriptions of the disclosure are given with reference to the exemplary embodiments illustrated with accompanied drawings. Wherever possible, in the drawings and the specification, the same or similar parts are denoted with same reference numerals.

It should be understood that when an element such as a layer, a film, an area, or a substrate is described as being "on" another element or "connected to" another element, the element may be directly on another element or connected to another element, or there may be other elements interposed therebetween. In contrast, when an element is described as being "directly on another element" or "directly connected to" another element, there is no other element therebetween. Herein, "connect" used in the specification may refer to physical and/or electrical connection. Furthermore, "electrically connect" or "coupled to" may mean that there are other elements interposed between two elements.

The usages of "approximately", "close to", or "substantially" throughout the specification include the indicated value and an average value within an acceptable deviation range of the specific value confirmed by those skilled in the art, considering the measurement in question and a specific number of errors related to the measurement (that is, the limitation of measurement system). For example, "approximately" may mean to be within one or more standard deviations of the value, or within ±30%, ±20%, ±10%, or ±5%. Furthermore, the usages of "approximately", "close to" or "substantially" throughout the specification allow selection of a more acceptable deviation scope or standard deviation depending on optical properties, etching properties, or other properties, and it is not necessary to use one standard deviation for all properties.

Unless otherwise defined, the terms used throughout the specification (including both technical and scientific terms) have the same meanings as understood by those skilled in the art. It should be further understood that, terms such as those defined in commonly used dictionaries should be interpreted as having meanings consistent with the meanings in the related art and the context of the invention, and shall not be interpreted as having idealized or overly formal meanings, unless definitely defined in the content.

Figure 2:
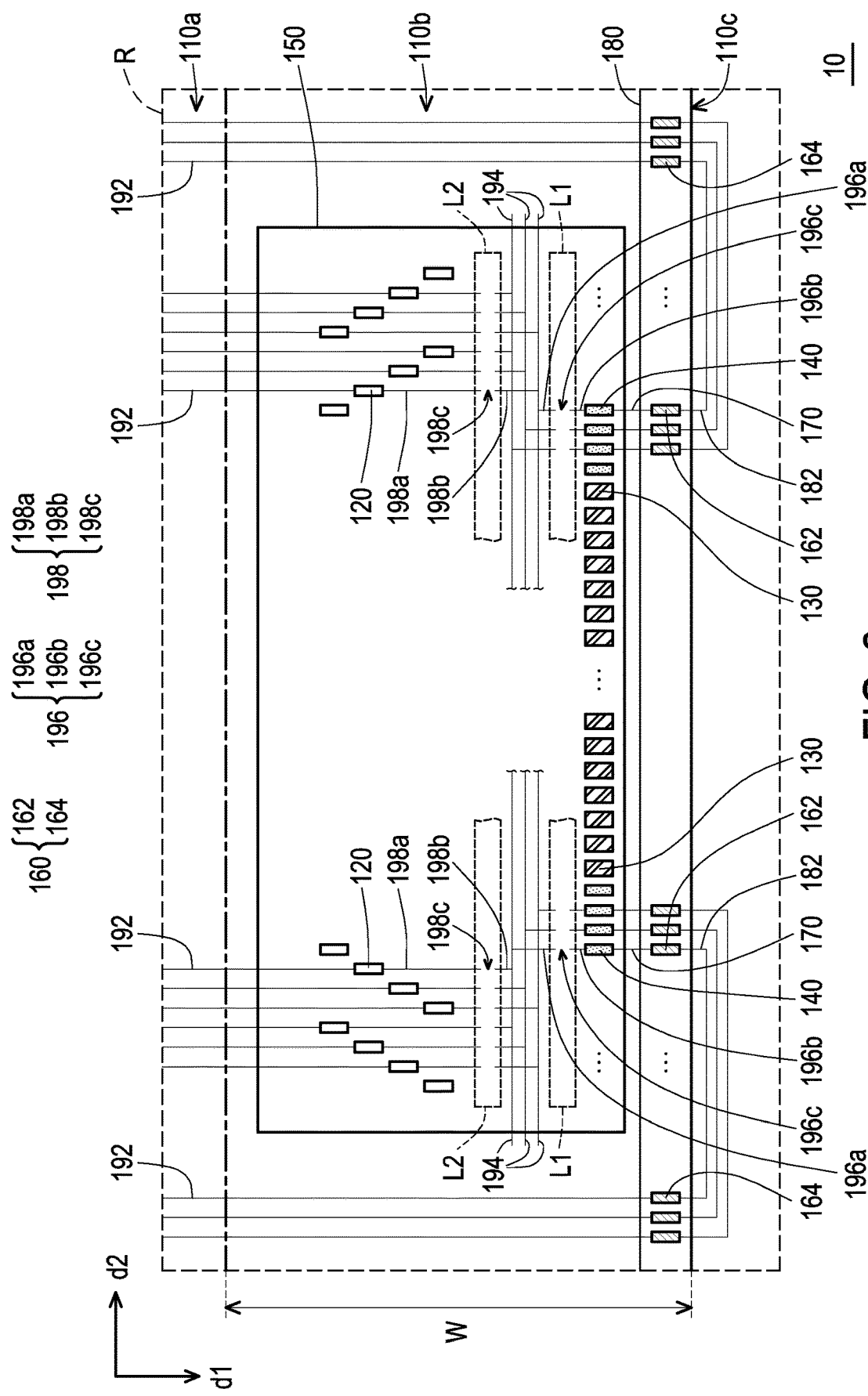
FIG. 2 is an enlarged partial schematic view of the electronic device of the first embodiment of the disclosure.

FIG. 1 is a schematic top view of an electronic device of the first embodiment of the disclosure FIG. 2 is an enlarged partial schematic view of the electronic device of the first embodiment of the disclosure. FIG. 2 corresponds to a partial region R of FIG. 1. FIG. 1 shows a substrate 110, a signal line 192, a driving chip 150, an auxiliary pad 140, an edge pad group 160, a first electronic component 180, and a second electronic component 190 of an electronic device 10, and omits other components.

Referring to FIG. 1 and FIG. 2, the electronic device 10 includes the substrates 110 with an active area 110a, a peripheral area 110b, and an edge 110c. The active area 110a, the peripheral area 110b, and the edge 110c are sequentially arranged in a first direction d1. For instance, in this embodiment, the edge 110c is a lower edge of the substrate 110, and the peripheral area 110b is a lower border area between the active area 110a and the lower edge, but the disclosure is not limited thereto. In this embodiment, the substrate 110 is made of glass, quartz, an organic polymer, an opaque/reflective material (such as wafer, ceramics, or other suitable materials), or other suitable materials.

The electronic device 10 further includes multiple output pads 120 and multiple input pads 130. The output pads 120 and the input pads 130 are disposed on the peripheral area 110b of the substrate 110. The input pads 130 are closer to the edge 110c of the substrate 110 than the output pads 120.

The electronic device 10 further includes multiple auxiliary pads 140, which are disposed on the peripheral area 110b of the substrate 110. The auxiliary pads 140 are closer to the edge 110c of the substrate 110 than the output pads 120, and the auxiliary pads 140 are located beside the input pads 130. In detail, in this embodiment, the auxiliary pads 140 and the input pads 130 are arranged in a row, but the disclosure is not limited thereto.

The electronic device 10 further includes the driving chip 150. The driving chip 150 is bonded to the input pads 130, the output pads 120, and the auxiliary pads 140 on the peripheral area 110b of the substrate 110. In this embodiment, the driving chip 150 is bonded to the input pads 130, the output pads 120, and the auxiliary pads 140 by Chip On Glass (COG), but the disclosure is not limited thereto.

The electronic device 10 further includes the edge pad groups 160, which are disposed on the peripheral area 110b of the substrate 110, and located between the driving chip 150 and the edge 110c of the substrate 110. Each of the edge pad groups 160 includes a first pad 162 and a second pad 164, which are arranged in a second direction d2. The first direction d1 and the second direction d2 intersect. For example, in this embodiment, the first direction d1 and the second direction d2 are perpendicular to each other, but the disclosure is not limited thereto.

The electronic device 10 further includes multiple first connection lines 170 disposed between the auxiliary pads 140 and the edge pad groups 160. Each of the first connection lines 170 is electrically connected to one of the auxiliary pads 140 and one of the first pads 162 of the edge pad groups 160.

The electronic device 10 further includes the first electronic component 180, which is bonded to the edge pad groups 160. In this embodiment, the electronic device 10 may further optionally include the second electronic component 190. Both ends of the first electronic component 180 are bonded to the edge pad groups 160 and the second electronic component 190, respectively, on the substrate 110. For example, in this embodiment, the first electronic component 18 is a flexible printed circuit board, and the second electronic component 190 is a rigid printed circuit board, but the disclosure is not limited thereto.

The first electronic component 180 has multiple conductive portions 182. The first pad 162 and the second pad 164 of each of the edge pad groups 160 are electrically connected to one of the conductive portions 182. The first pad 162 and the second pad 164 of each of the edge pad groups 160 are electrically connected to each other. For example, in this embodiment, the conductive portion 182 of the first electronic component 180 includes a bent wire. Both ends of the bent wire are respectively electrically connected to the first pad 162 and the second pad 164 of the same edge pad group 160 at two opposite sides. In other words, in this embodiment, the first pad 162 and the second pad 164 of each of the edge pad groups 160 are electrically connected to each other by using the conductive portion 182 of the first electronic component 180. However, the disclosure is not limited thereto. In another embodiment not shown here, the conductive portion 182 of the first electronic component 180 includes a first wire (not shown) and a second wire (not shown) separated from each other. A first end of the first wire and a first end of the second wire are electrically connected to the first pad 162 and the second pad 164 of the same edge pad group 160, respectively. A second end of the first wire and a second end of the second wire are electrically connected to each other through a conductive portion (not shown) of the second electronic component 190. In other words, in another embodiment not shown here, the first pad 162 and the second pad 164 of each of the edge pad groups 160 are electrically connected to each other by using the conductive portion 182 of the first electronic component 180 and the conductive portion (not shown) of the second electronic component 190.

The electronic device 10 further includes multiple signal lines 192 disposed on the active area 110a and the peripheral area 110b of the substrate 110. The signal lines 192 are electrically connected to the output pads 120 and the second pads 164 of the edge pad groups 160.

In this embodiment, the signal lines 192 are multiple data lines and/or multiple touch-sensing lines. For example, in this embodiment, the signal lines 192 include multiple data lines and multiple touch-sensing lines, but the disclosure is not limited thereto. The electronic device 10 further includes multiple pixel structures (not shown) disposed on the active area 110a. Each of the pixel structures includes a pixel transistor and a pixel electrode. The data line may be a wire electrically connected to a first end of the pixel transistor of the pixel structure. In this embodiment, the electronic device 10 further optionally includes multiple touch-sensing structures (not shown) disposed on the active area 110a. Each of the touch-sensing structures includes a readout transistor and a touch-sensing electrode. The touch-sensing line may be a wire electrically connected to a first end of the readout transistor of the touch-sensing structure.

In this embodiment, on the peripheral area 110b, a semiconductor pattern (not shown) is optionally disposed between the signal lines 192 used to carry different signals to achieve signal shielding and prevention of interference between different signals.

It is to be noted that in this embodiment, although the auxiliary pad 140 is disposed beside the input pad 130, the auxiliary pad 140 is used as an output pad, and the driving chip 150 provides an output signal to the auxiliary pad 140. The output signal transmitted to the auxiliary pad 140 may be electrically connected to a portion of the signal lines 192 through the conductive portion 182 of the first electronic component 180 and the edge pad group 160 disposed beside the edge 110c of the substrate 110. In other words, the auxiliary pad 140 used as the output pad is electrically connected to the corresponding signal line 192 through the conductive component disposed outside the substrate 110 (for example, the conductive portion 182 of the first electronic component 180). In this way, the area occupied by a conductive member disposed on the peripheral area 110b of the substrate 110 is reduced so as to further reduce a border width W.

The difference between an electronic device of a comparative example not shown here and the electronic device 10 of this embodiment is that the design of the auxiliary pad 140 is not used in the electronic device of the comparative example. The border width of the electronic device of the comparative example is 7174 μm. The border width W of the electronic device of this embodiment is 6510 μm, which is 664 μm less than the border width of the electronic device of the comparative example.

In this embodiment, the electronic device further optionally includes multiple bus lines 194 and multiple first conductive components 196. The bus lines 194 are disposed between the output pads 120 and the input pads 130. The first conductive components 196 are disposed between the bus lines 194 and the auxiliary pads 140. Each of the first conductive components 196 has a first break 196c and a first portion 196a and a second portion 196b spaced by the first break 196c. The first portion 196a of each of the first conductive components 196 is electrically connected to one of the bus lines 194. The second portion 196b of each of the first conductive components 196 is electrically connected to one of the auxiliary pads 140.

In this embodiment, the electronic device 10 further optionally includes multiple second conductive components 198, which are disposed between the output pads 120 and the bus lines 194. Each of the second conductive components 198 has a second break 198c and a first portion 198a and a second portion 198b spaced by the second break 198c. The first portion 198a of each of the second conductive components 198 is electrically connected to one of the output pads 120. The second portion 198b of each of the second conductive components 198 is electrically connected to one of the bus lines 194.

In this embodiment, during fabrication of the electronic device 10, the first conductive component 196 and the second conductive component 198 have not been broken off yet, and the output pad 120 and the auxiliary pad 140 used as the output pad are electrically connected to the bus lines 194 through the first conductive component 196 and the second conductive component 198, which are not broken off, to perform an electrical test. After the electrical test is completed, the first conductive component 196 and the second conductive component 198 are broken off, and the first break 196c and the second break 198c are formed.

For example, in this embodiment, a first laser cutting area L1 is formed between the bus line 194 and the auxiliary pad 140, and a second laser cutting area L2 is formed between the output pad 120 and the bus line 194. The first laser cutting area L1 and the second laser cutting area L2 overlap with the first conductive component 196 and the second conductive component 198, which have not been broken off, respectively. After the electrical test is completed, the first conductive component 196 and the second conductive component 198 are cut by a laser cutting process to form the first break 196c and the second break 198c. In this embodiment, the driving chip 150 overlaps the first break 196c of the first conductive component 196 and the second break 198c of the second conductive component 198 after the driving chip 150 is bonded.

It should be noted here that the following embodiments use the same reference numerals and parts as the previous embodiments, where the same reference numerals indicate the same or similar components, and the description of the same technical content is omitted. The description of the omitted parts can be found in the preceding embodiments, and will not be repeated in the following embodiments.

Figure 3:
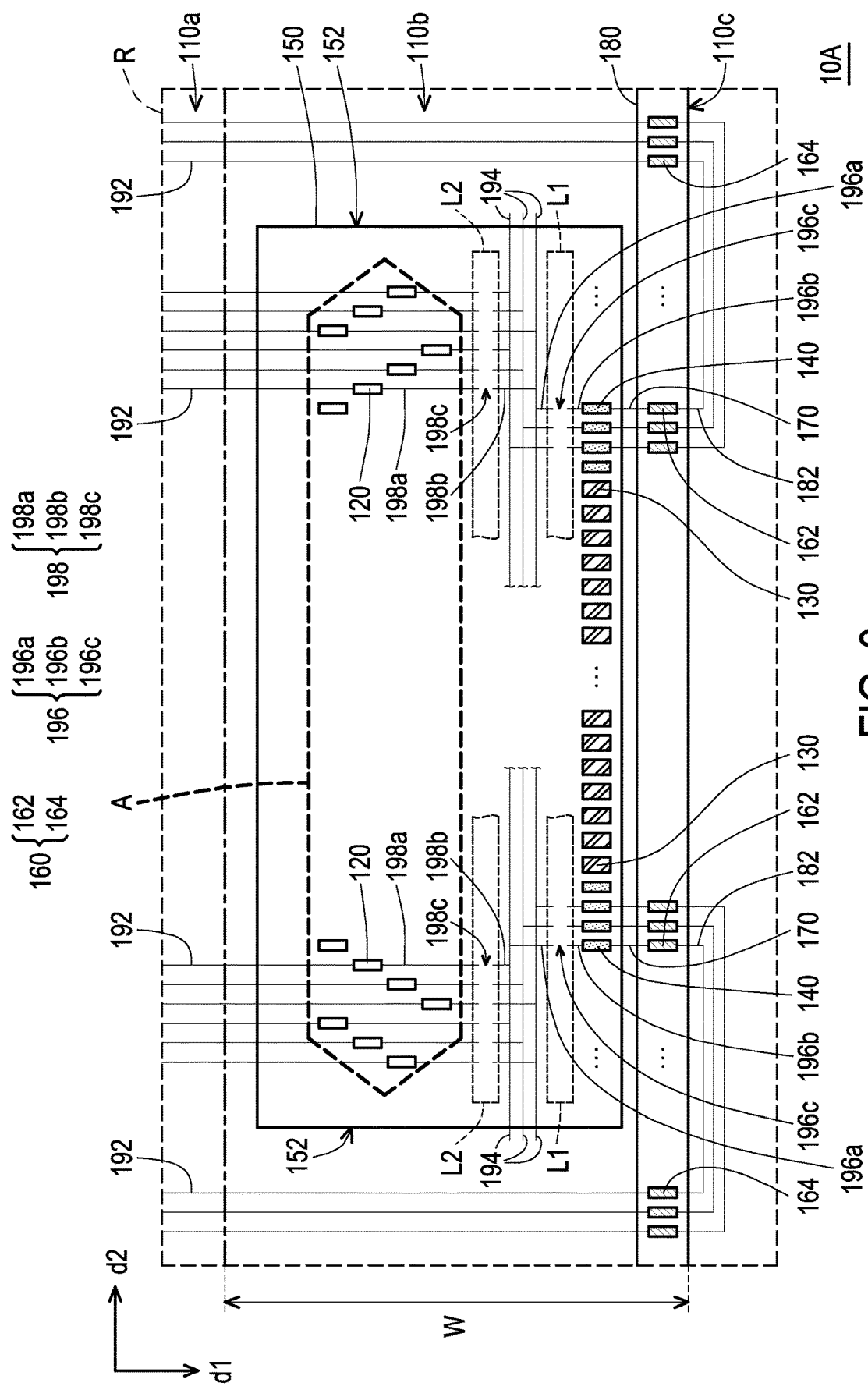
FIG. 3 is an enlarged partial schematic view of an electronic device of the second embodiment of the disclosure.

FIG. 3 is an enlarged partial schematic view of an electronic device of the second embodiment of the disclosure. An electronic device 10A of the second embodiment of FIG. 3 is similar to the electronic device 10 of the first embodiment of FIG. 2 except that: a disposition range A of the output pads 120 of the electronic device 10A of FIG. 3 is different from a disposition range of the output pads 120 of the electronic device 10 of FIG. 2. In the embodiment of FIG. 3, the disposition range A of the output pads 120 tapers off toward the both sides 152 of the driving chip 150, which optimizes the space utilization of the peripheral area 110b of the substrate 110.

The border width W of the electronic device 10A of this embodiment is 6107 μm, which is 1067 μm less than the border width of the electronic device of the comparative example.

Figure 4:
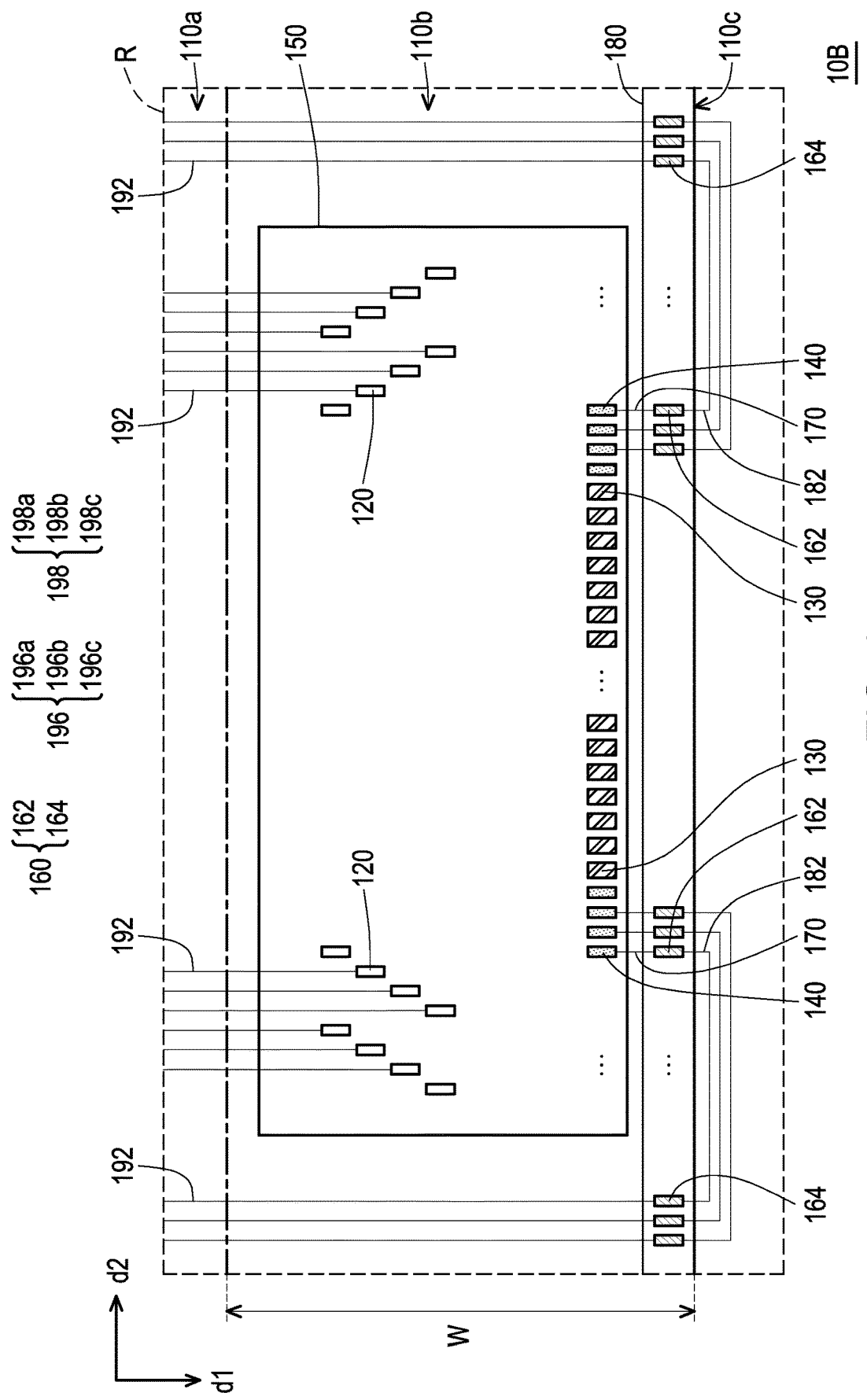
FIG. 4 is an enlarged partial schematic view of an electronic device of the third embodiment of the disclosure.

FIG. 4 is an enlarged partial schematic view of an electronic device of the third embodiment of the disclosure. An electronic device 10B of the third embodiment of FIG. 4 is similar to the electronic device 10 of the first embodiment of FIG. 2 except that: the bus line 194, the first conductive component 196, and the second conductive component 198 of the electronic device 10 of FIG. 2 are not included in the electronic device 10B of FIG. 4.

The border width W of the electronic device 10B of this embodiment is 6270 μm, which is 904 μm less than the border width of the electronic device of the comparative example.

Figure 5:
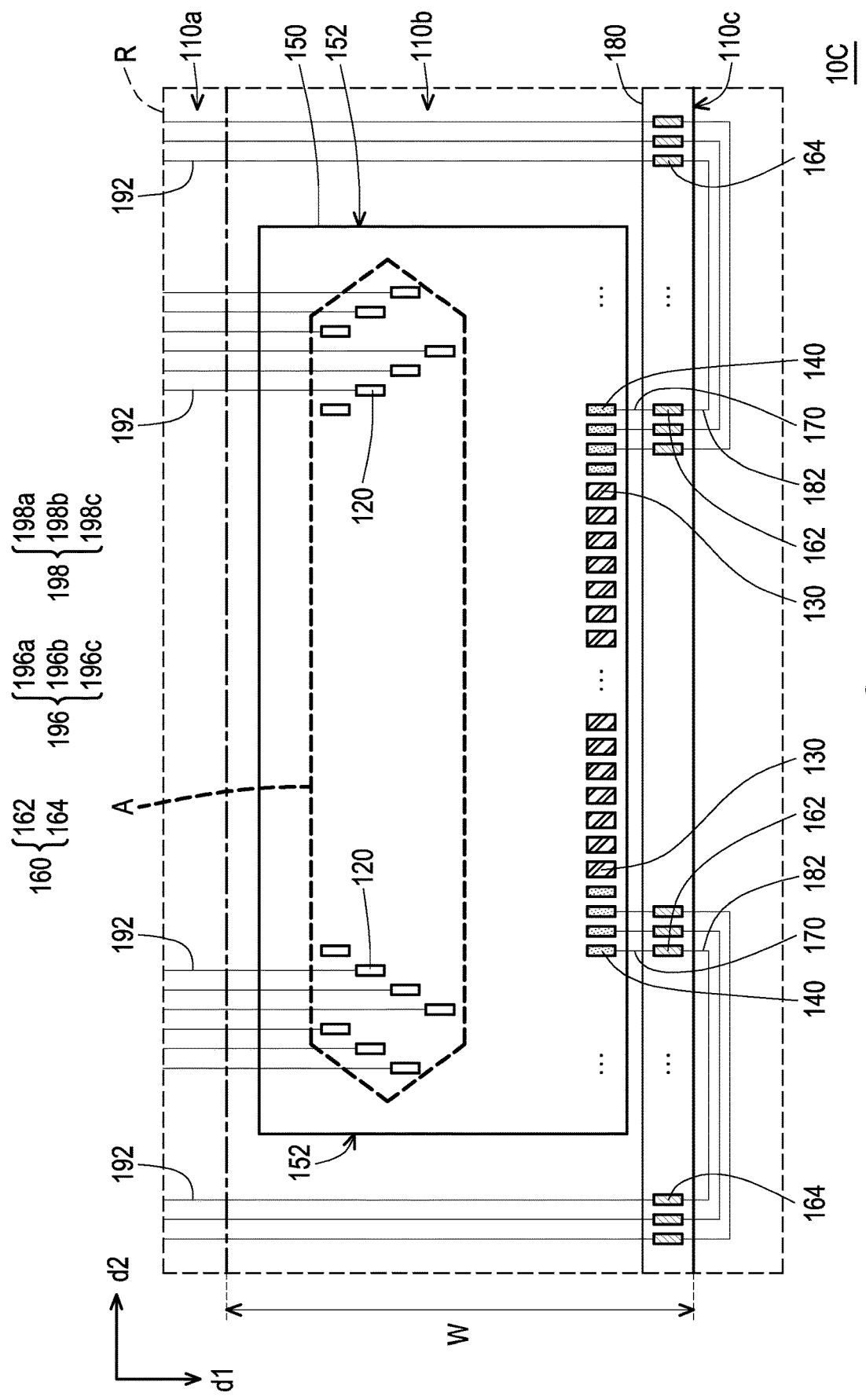
FIG. 5 is an enlarged partial schematic view of an electronic device of the fourth embodiment of the disclosure.

FIG. 5 is an enlarged partial schematic view of an electronic device of the fourth embodiment of the disclosure. An electronic device 10C of the fourth embodiment of FIG. 5 is similar to the electronic device 10A of the second embodiment of FIG. 3 except that: the bus line 194, the first conductive component 196, and the second conductive component 198 of the electronic device 10A of FIG. 3 are not included in the electronic device 10C of FIG. 5.

The border width W of the electronic device 10C of this embodiment is 5867 μm, which is 1307 μm less than the border width of the electronic device of the comparative example.

Figure 6:
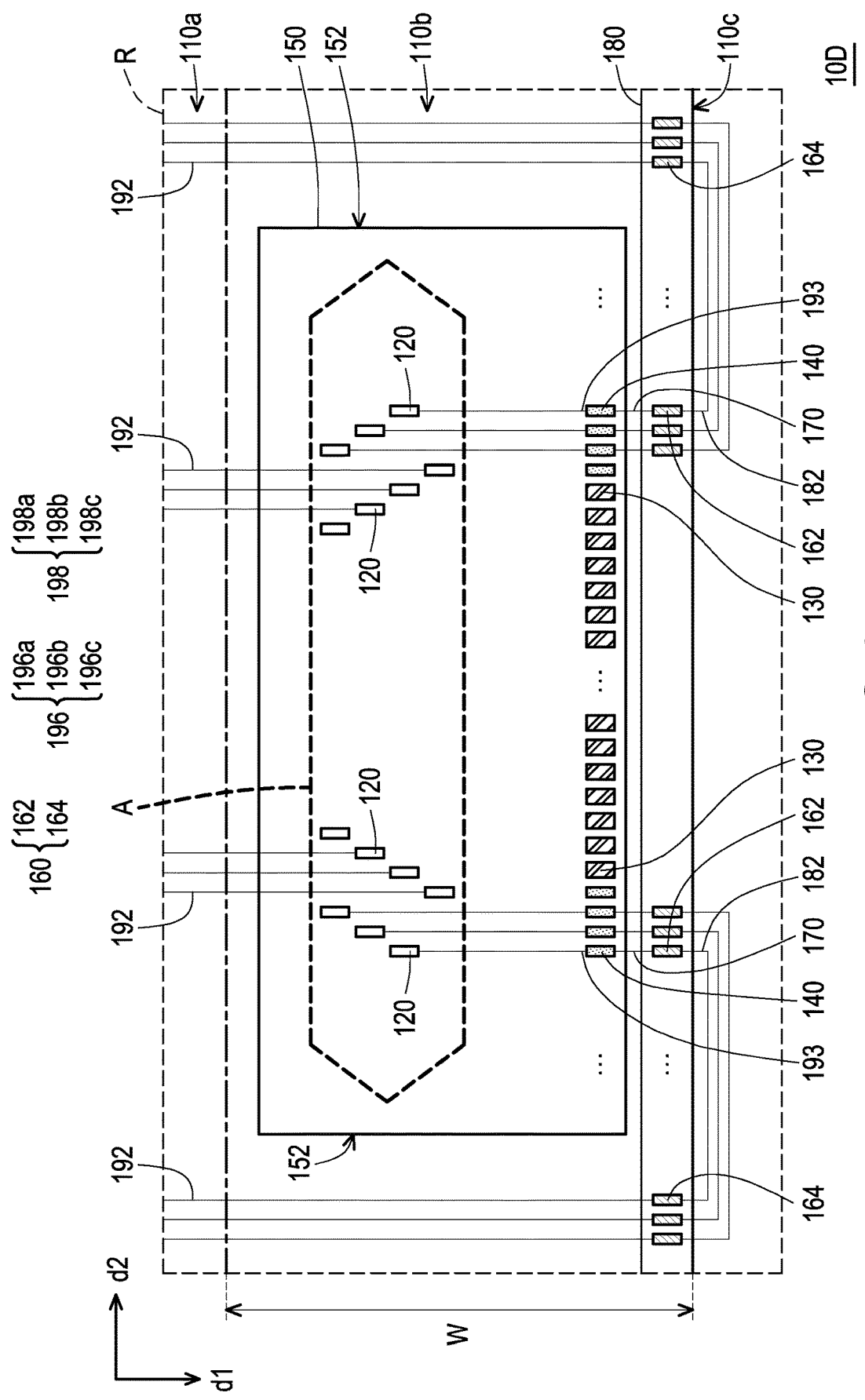
FIG. 6 is an enlarged partial schematic view of an electronic device of the fifth embodiment of the disclosure.

FIG. 6 is an enlarged partial schematic view of an electronic device of the fifth embodiment of the disclosure. An electronic device 10D of the fifth embodiment of FIG. 6 is similar to the electronic device 10A of the second embodiment of FIG. 3, and the differences will be described below.

The bus line 194, the first conductive component 196, and the second conductive component 198 of the electronic device 10A of FIG. 3 are not included in the electronic device 10D of FIG. 6. The electronic device 10D of FIG. 6 includes multiple second connection lines 193 electrically connected to a portion of the output pads 120 and the auxiliary pads 140. In the embodiment of FIG. 6, the auxiliary pad 140 disposed beside the input pad 130 is used as a dummy pad, which allows the wire electrically connected to the surrounding output pad 120 (that is, a combination of the second connection line 193, the first connection line 170, and the conductive portion 182) to extend away from the active area 110*a* and then turn around to the active area 110*a* to achieve effective space utilization and balance the bonding stress of the driving chip 150. In the embodiment of FIG. 6, the second connection line 193 is electrically connected to the first connection line 170 through the auxiliary pad 140. However, the disclosure is not limited thereto.

In another embodiment, the second connection line 193 is directly connected to the first connection line 170. The second connection line 193 and the first connection line 170 are directly connected or electrically connected through the auxiliary pad 140, as required so as to balance space utilization and bonding stress.

Figure 7:
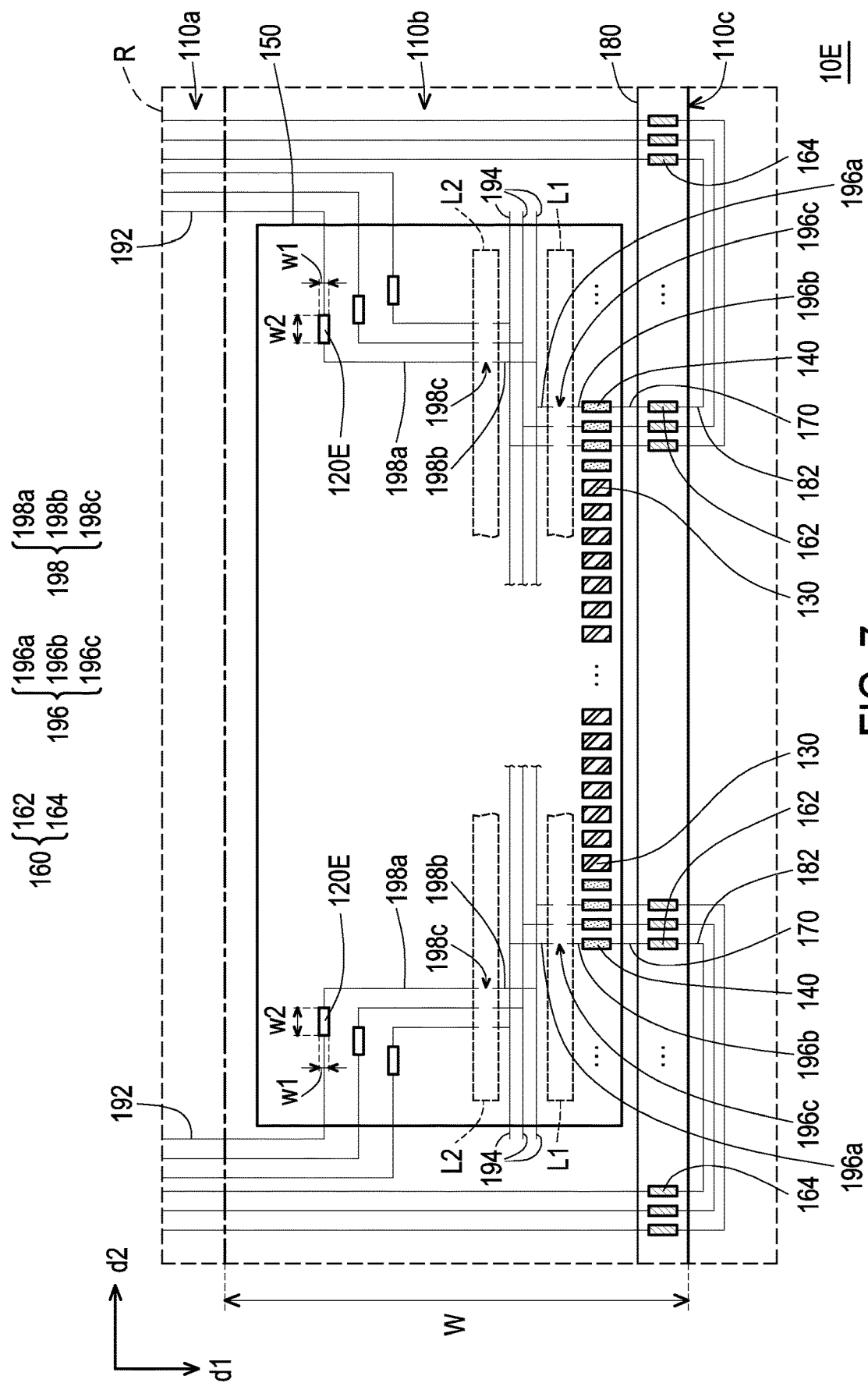
FIG. 7 is an enlarged partial schematic view of an electronic device of the sixth embodiment of the disclosure.

FIG. 7 is an enlarged partial schematic view of an electronic device of the sixth embodiment of the disclosure. An electronic device 10E of the sixth embodiment of FIG. 7 is similar to the electronic device 10 of the first embodiment of FIG. 2, and the differences will be described below.

In the embodiment of FIG. 7, the auxiliary pads 140 and the input pads 130 are arranged in the second direction d2. One of multiple output pads 120E has a first width w1 and a second width w2, respectively, in the first direction d1 and the second direction d2, and the second width w2 is larger than the first width w1. In short, in the embodiment of FIG. 7, the output pad 120E is arranged sideway to further reduce the border width W (refer to FIG. 1).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a substrate having an active area, a peripheral area, and an edge, wherein the active area, the peripheral area, and the edge are sequentially arranged in a first direction;
   a plurality of output pads disposed on the peripheral area of the substrate;
   a plurality of input pads disposed on the peripheral area of the substrate, wherein the input pads are closer to the edge of the substrate than the output pads;
   a plurality of auxiliary pads disposed on the peripheral area of the substrate, wherein the auxiliary pads are closer to the edge of the substrate than the output pads, and the auxiliary pads are located beside the input pads;
   a driving chip bonded to the input pads, the output pads, and the auxiliary pads;
   a plurality of edge pad groups disposed on the peripheral area of the substrate and located between the driving chip and the edge of the substrate, wherein each of the edge pad groups comprises a first pad and a second pad arranged in a second direction, and the first direction and the second direction intersect;
   a plurality of first connection lines disposed between the auxiliary pads and the edge pad groups, wherein each of the first connection lines is electrically connected to one of the auxiliary pads and one of the first pads of the edge pad groups;
   a first electronic component bonded to the edge pad groups, wherein the first electronic component has a plurality of conductive portions, the first pad and the second pad of each of the edge pad groups are electrically connected to one of the conductive portions, and the first pad and the second pad of each of the edge pad groups are electrically connected to each other; and
   a plurality of signal lines disposed on the active area and the peripheral area of the substrate, wherein the signal lines are electrically connected to the output pads and the second pads of the edge pad groups.

2. The electronic device according to claim 1, further comprising:
   a plurality of bus lines disposed between the output pads and the input pads; and
   a plurality of first conductive components disposed between the bus lines and the auxiliary pads, wherein each of the first conductive components has a first break and a first portion and a second portion spaced by the first break, the first portion of each of the first conductive components is electrically connected to one of the bus lines, and the second portion of each of the first conductive components is electrically connected to one of the auxiliary pads.

3. The electronic device according to claim 2, further comprising:
   a plurality of second conductive components disposed between the output pads and the bus lines, wherein each of the second conductive components has a second break and a first portion and a second portion spaced by the second break, the first portion of each of the second conductive components is electrically connected to one of the output pads, and the second portion of each of the second conductive component is electrically connected to one of the bus lines.

4. The electronic device according to claim 1, further comprising:

a plurality of second connection lines electrically connected to a portion of the output pads and the auxiliary pads.

5. The electronic device according to claim 1, wherein the auxiliary pads and the input pads are arranged in the second direction, one of the output pads has a first width and a second width in the first direction and the second direction, respectively, and the second width is larger than the first width.

6. An electronic device, comprising:
a substrate having an active area, a peripheral area, and an edge, wherein the active area, the peripheral area, and the edge are sequentially arranged in a first direction;
a plurality of output pads disposed on the peripheral area of the substrate;
a plurality of input pads disposed on the peripheral area of the substrate, wherein the input pads are closer to the edge of the substrate than the output pads;
a plurality of auxiliary pads disposed on the peripheral area of the substrate, wherein the auxiliary pads are closer to the edge of the substrate than the output pads, and the auxiliary pads are located beside the input pads;
a plurality of bus lines disposed between the output pads and the input pads;
a plurality of first conductive components disposed between the bus lines and the auxiliary pads, wherein each of the first conductive components has a first break and a first portion and a second portion spaced by the first break, the first portion of each of the first conductive components is electrically connected to one of the bus lines, and the second portion of each of the first conductive components is electrically connected to one of the auxiliary pads; and
a driving chip bonded to the input pads, the output pads, and the auxiliary pads.

7. The electronic device according to claim 6, wherein the driving chip overlaps the first break.

8. The electronic device according to claim 6, further comprising:
a plurality of second conductive components disposed between the output pads and the bus lines, wherein each of the second conductive components has a second break and a first portion and a second portion spaced by the second break, the first portion of each of the second conductive components is electrically connected to one of the output pads, and the second portion of each of the second conductive components is connected to one of the bus lines.

9. The electronic device according to claim 8, wherein the driving chip overlaps the first break and the second break.

* * * * *